United States Patent
Caldwell

(10) Patent No.: US 6,842,527 B2
(45) Date of Patent: Jan. 11, 2005

(54) DYNAMIC ALLOCATION OF POWER SUPPLIED BY A POWER SUPPLY AND FREQUENCY AGILE SPECTRAL FILTERING OF SIGNALS

(75) Inventor: Rocky Caldwell, Carmel, IN (US)

(73) Assignee: Thomson Licensing, Inc., Boulogne-Billancourt (FR)

( * ) Notice: Subject to any disclaimer, the term of this patent is extended or adjusted under 35 U.S.C. 154(b) by 811 days.

(21) Appl. No.: 09/737,688

(22) Filed: Dec. 15, 2000

(65) Prior Publication Data

US 2002/0076067 A1 Jun. 20, 2002

(51) Int. Cl.[7] .............................. H03G 3/20; H04R 3/00; H03F 21/00
(52) U.S. Cl. ........................................ 381/110; 381/120
(58) Field of Search ................................. 381/110, 120, 381/323, 28, 123, 58, 59; 323/364; 327/544

(56) References Cited

U.S. PATENT DOCUMENTS

| | | | |
|---|---|---|---|
| 4,649,565 A | | 3/1987 | Kaizer |
| 4,809,339 A | * | 2/1989 | Shih et al. .................. 381/110 |
| 5,091,700 A | * | 2/1992 | Smith ......................... 381/120 |
| 5,347,230 A | | 9/1994 | Noro .......................... 330/297 |
| 5,636,288 A | | 6/1997 | Bonneville et al. ......... 381/110 |
| 5,748,753 A | | 5/1998 | Carver |
| 5,834,977 A | | 11/1998 | Maehara et al. |
| 6,026,168 A | | 2/2000 | Li et al. ........................ 381/28 |
| 6,118,267 A | * | 9/2000 | Eitan et al. .................. 323/364 |
| 6,424,875 B1 | * | 7/2002 | Yoon .......................... 381/110 |
| 6,711,271 B2 | * | 3/2004 | Hou ........................... 381/323 |

OTHER PUBLICATIONS

Search Report for PCT Appln PCT/US01/46702 dated Jun. 25, 2003.

* cited by examiner

*Primary Examiner*—Stella Woo
(74) *Attorney, Agent, or Firm*—Joseph S. Tripoli; Robert D. Shedd; Reitseng Lin

(57) ABSTRACT

The power voltage supply for a power amplifier is switched between an operational full power mode and a reduced power mode by the switching of a dual state impedance device connected in series between the power amplifier and the power supply. A control circuit detects the level of a signal to be amplified by that amplifier and switches the impedance states thus reducing the power output capability of the power amplifier and placing the power amplifier into a reduced power mode. In one embodiment, the signal is produced by spectrally filtering with a low pass filter, with the cross-over frequency being adjustable. Additionally, the gain of the amplifier can be reduced for high level signals.

20 Claims, 2 Drawing Sheets

DYNAMIC ALLOCATION OF POWER SUPPLIED BY A POWER SUPPLY AND FREQUENCY AGILE SPECTRAL FILTERING OF SIGNALS

TECHNICAL FIELD

The present invention relates to power supply circuit arrangements for electrical equipment, and more particularly, is applicable to power supply circuit arrangements which allow equipment to be switched between an operational mode, and a reduced power or standby mode.

BACKGROUND

Some high fidelity audio systems, e.g., so-called "surround sound" systems using Dolby Pro-logic™ or Dolby Digital™ include power amplifiers for each of the sound signals provided by such Dolby™ systems, e.g., left, right, center, left rear, right rear. In a home audio system, these audio power amplifiers would be powered by a common main power supply.

Normally, for a comfortable listening level, one needs to boost the signal response in the low frequency bass range. The Dolby™ systems provide a sub-woofer signal which is outputted to a sub-woofer system, which can be a separate active unit which includes a preamplifier/buffer, a high power audio power amplifier, and a large diameter loudspeaker for providing a sufficient audio output at low bass frequencies below the frequencies of a regular woofer. The sub-woofer comes with its own dedicated audio power amplifier in order to boost the sound in the low frequency range to overcome a shortcoming in total sound quality because the sub-woofer bass sounds require a disproportionately large amount of power to be sufficiently heard due to the characteristics of the human ear response, the usually insufficient dimensions of the listening room, and because the sub-woofer loudspeaker, which has a much larger structure than other loudspeakers of a speaker system, requires more power just to move its large mass and the accordingly large amount of air moved by the speaker cone. This way, the dedicated sub-woofer power supply drives the sub-woofer and this large amount of power is not a load on the main amplifier power supply which powers the various other amplifiers thus permitting the other sounds to be fully reproduced.

However, the use of a separate active sub-woofer has a higher total system cost, and is prone to low frequency signal overload (too much bass) because it requires separate volume controls for the main unit and the sub-woofer. Thus, an increase adjustment of the main volume control can cause such bass overload. Power supplies are very expensive since they require a power transformer, rectifiers, and large filter capacitors. In order to save the considerable expense of providing a separate power supply for the high powered sub-woofer power amplifier, it is desirable for the sub-woofer power amplifier to share the same power supply with the main audio power amplifiers. Such an integrated system arrangement is used in RCA home theater model RT2250 made by Thomson Consumer Electronics Inc., Indianapolis, Ind., USA, which includes a dedicated sub-woofer power amplifier powered from the same power supply as the main audio amplifiers.

However, having accomplished this substantial cost reduction, we are again faced with the original problem of the drain of a large amount of power from the main power supply when the power is needed for the main power amplifiers. One solution is to make the main power supply much larger, but this is very expensive and adds considerable weight to the unit. Thus, such an approach is counterproductive.

Much of the time, the main power supply, e.g., having a 50 watt audio output capability, is only lightly loaded even if music is played "very loud". In even large homes, playing at a one watt average output level would probably rattle windows, much less damage hearing. The reason for the desirability of high power output amplifiers (which do sound better) is so that the peaks of the signal are not clipped or distorted even if played at such a "very loud" sound level. Therefore, the high power capability of the main power supply for the main power amplifiers is mostly not used. Thus, powering the dedicated sub-woofer large power amplifier from the main power supply, including setting the maximum sub-woofer power to be more than the main channel power, would usually not be in conflict with the needs of the main power amplifiers. In this manner, the sub-woofer can deliver double power for low frequency components because in the normal case, the mid-range music content only delivers a small portion of the energy relative to the sub-woofer low frequency range. In this manner, the system can more efficiently utilize the whole power of the amplification system while greatly reducing costs.

Another problem is that with the sub-woofer system gain set for a disproportionally higher power output in order to compensate for the lesser audible effect on the listener in the sub-woofer audio frequencies, as discussed above, the sub-woofer system output can easily reach full output with the sub-woofer sound signal being "clipped", or with the sub-woofer loudspeaker reaching its physical limits and distorting the reproduced sub-woofer sound.

U.S. patents where an electronic action is initiated in response to a signal and in connection with sub-woofers are: U.S. Pat. No. 6,026,168 wherein level adjustment is made to sub-woofer signals in response to the volume of a scaled main signal; U.S. Pat. No. 5,636,288 wherein the AC power to a separate integral power amplifier of a sub-woofer system is shut-off in response to detection of an on-off signal; and U.S. Pat. No. 5,347,230 wherein an auxiliary power source is activated in response to the level of an audio signal so that the output power capability and power dissipation of the output transistors are reduced at low signal levels and higher at high signal levels, with different parameters being used to reduce ripple voltage in connection with sub-woofer frequencies.

SUMMARY OF THE INVENTION

According to aspects of the present invention, the conflict is resolved by the dynamic allocation of power from the power supply between the main power amplifiers and the sub-woofer power amplifier. When a control circuit detects an audio signal above a predetermined threshold in the sub-woofer frequency range, a switch is operated which reduces the amount of power available from the main power supply to the auxiliary sub-woofer power amplifier thus switching the auxiliary power amplifier from a fully operational mode to a lower power mode, while still providing a large low frequency bass output sound level but at a reduced power supply cost.

For sub-woofer arrangements, the sub-woofer signal can be derived in two ways. One way is for systems which use one of the Dolby™ systems as discussed above, which provide a separate decoded output signal for sub-woofer sound reproduction. This sub-woofer audio signal can also be used to engage the dynamic power allocation action disclosed herein. For an amplifier system which does not use one of the Dolby™ systems, a single/plural stage low pass filter can be used for deriving the sub-woofer sound signal which is used in the same manner as the sub-woofer signal derived from one of the Dolby™ sound systems. However, for this non-Dolby™ arrangement, the cut-off frequency for the low pass filter can be changed, i.e., be frequency agile, and be chosen according to the type of music or the tastes of the listener.

The change of power supply status of the auxiliary circuit is provided by a variable-impedance connected in series with the power input to the auxiliary circuit and responsive to a control signal. The variable impedance is changed/ switched between first and second impedance states responsive to the control signal, thus producing corresponding first and second power supply voltages/currents for the auxiliary circuit which correspond to the operating and non-zero reduced power modes. In the first impedance state, the power supply voltage/current supplied to the auxiliary circuit permits its full power operation, and in the second impedance state, the power supply voltage/current supplied to the auxiliary circuit is inadequate for full power operation. It is within the contemplation of the present invention that this reduced power mode can include a standby status wherein the auxiliary circuit is momentarily placed in a non-operational standby mode. However, in either state of the auxiliary power amplifier, the power supply voltage/ current supplied to the main power circuit(s) is/are adequate for normal operation.

In a preferred embodiment, the first impedance state corresponds to a low resistance, the supply voltage/current applied to the auxiliary power amplifier is the full operating voltage and the second impedance state corresponds to a relatively higher resistance state so that the maximum power output from the auxiliary circuit is reduced.

The variable-impedance in the exemplary embodiment comprises a fast acting relay having its operating coil connected to the control circuit and a switch contact connected in parallel with an impedance such as a power resistor. Opening of the switch contact inserts the impedance in series with the power supply, reducing the power supply voltage/current provided to the auxiliary amplifier to a lower level. Conversely, closing the switch contact short-circuits the impedance, putting a zero or negligible impedance into the power supply path, thus raising the common power supply voltage available for full power output of the auxiliary amplifier. For momentary peak power levels shorter in duration than the reaction time of the relay, the power supply capacitors should be sufficiently large to maintain power supply voltages/currents.

Instead of a relay, an optoelectronic switch, or other suitable switch can be substituted, such as a field effect transistor (FET) in combination with an optical coupler or the like, which have a faster reaction time than a relay and with greater reliability. Such an optically coupled switch, like a relay, would provide electrical isolation between the control circuit and the circuit which is controlled by the device, if such electrical isolation is desirable.

Although the present discussion is presented in connection with a sub-woofer and its dedicated auxiliary power amplifier, other amplifier and power supply arrangements can be similarly switched. Additionally, the relay contacts can be single pole double throw (spdt) to alternately switch two power amplifiers with each deriving their power from a common power supply node, or the relay contacts can be double pole double throw (dpdt) for switching disparate operations.

DESCRIPTION OF THE PREFERRED EMBODIMENT(S)

Figure 1:
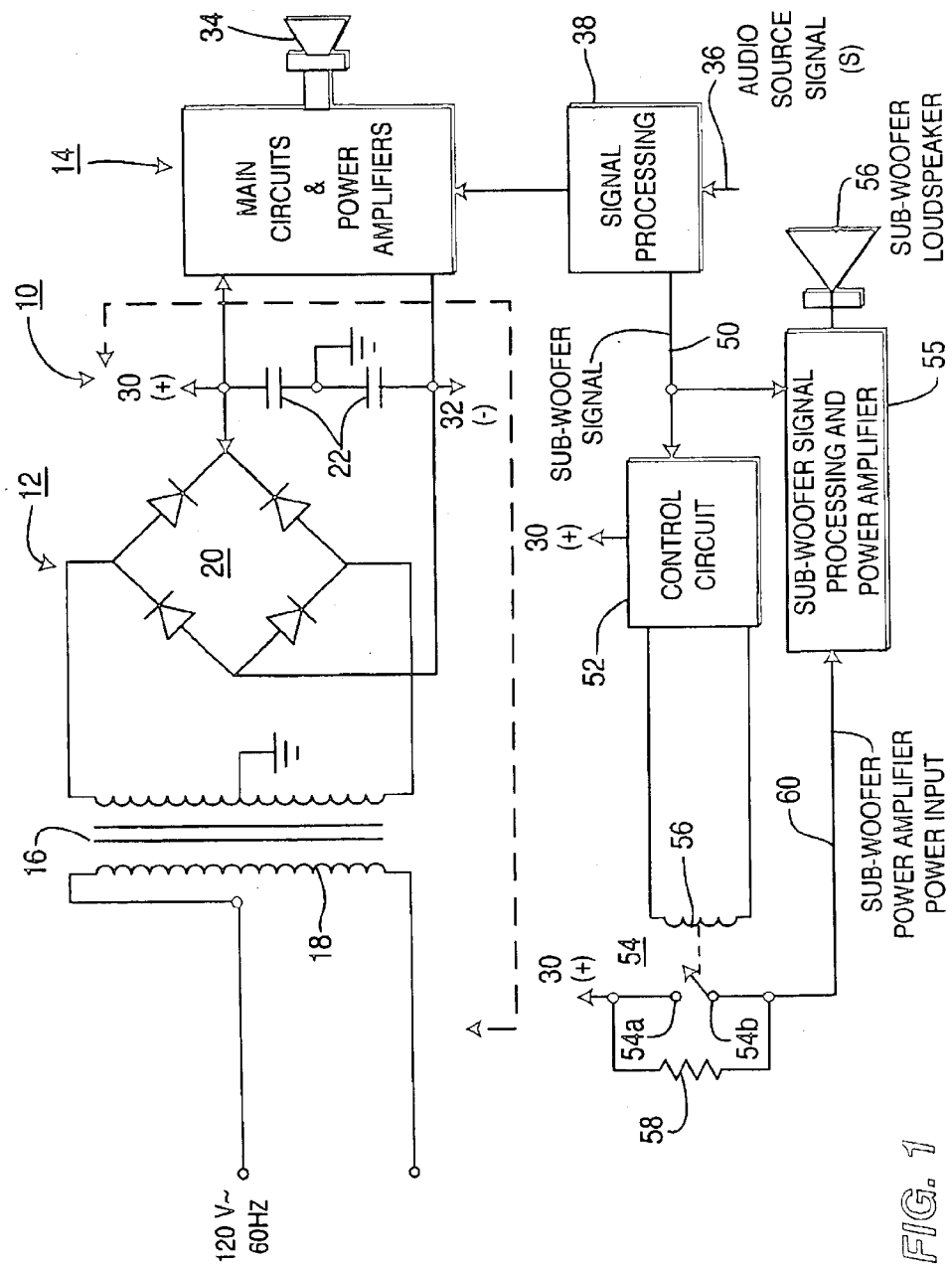
FIG. 1 is a block schematic diagram including a power supply arrangement for switching electrical apparatus between an operational mode and a reduced power mode.

FIG. 1 shows an amplifier system 10 which includes a power supply 12 and amplifier circuits including power amplifiers 14. Power supply 12 shows a power transformer 16 having a primary winding 18 connectable to an AC power line, a secondary winding 20 connected to a full wave diode bridge 21, and power supply filter capacitors 22 for providing DC power of appropriate voltage and current to amplifier circuits 14 at nodes 30 (+) and 32 (−). There are many possible configurations for power supply 12, for example, the power supply 12 is balanced with a center-tapped ground. The power supply shown is merely exemplary and forms no part of the present invention. In this regard, it should be noted that in a television receiver having a CRT video display, some audio power amplifiers may be powered from the flyback circuit.

Main circuits and power amplifiers 14 includes audio circuitry other than sub-woofer signal processing and loudspeaker drive, and provide power output to a plurality of loudspeakers symbolically represented by single loudspeaker 34. Audio source signals are provided at terminal 36, which can be any possible signal sources, e.g., a DVD device, a CD device, a tuner, audio tape device, video tape device, etc. These signals are processed by signal processors which include the functions of tone and volume control, switches for source signal selection, and Dolby™ or other such system, if used.

Figure 2:
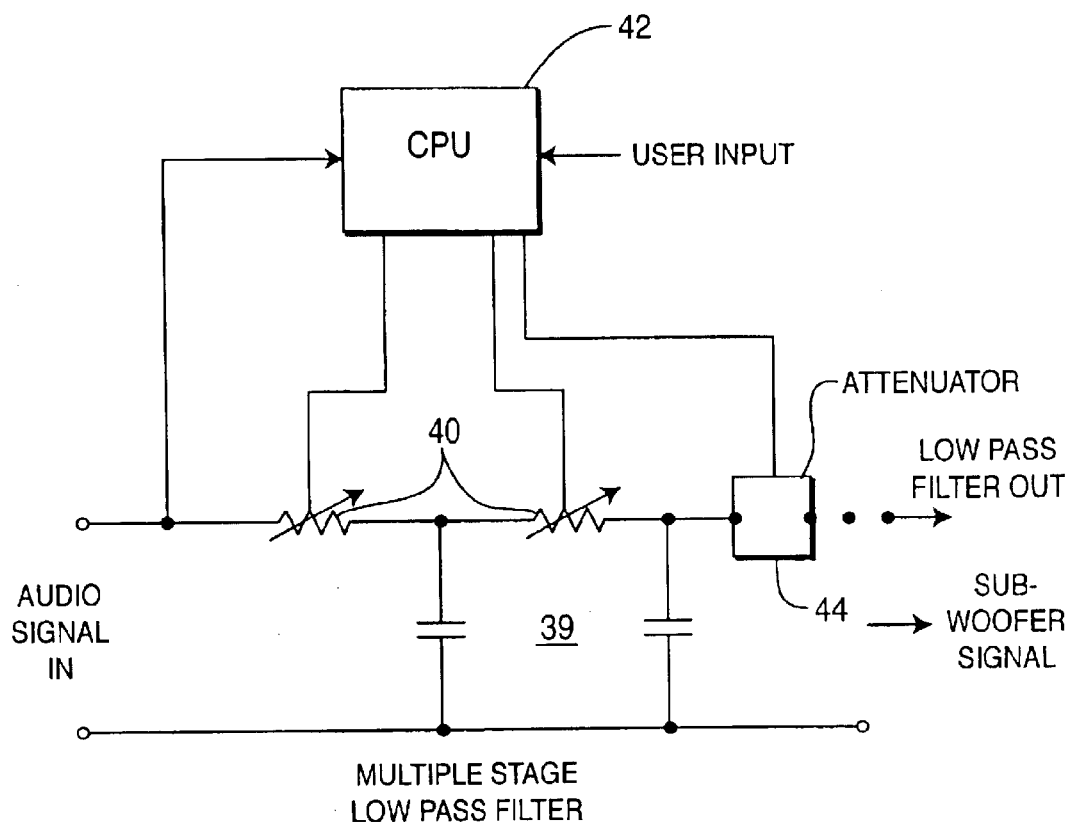
FIG. 2 is a representative schematic for a multi-stage adjustable low pass filter for providing the sub-woofer signal of FIG. 1.

Signal processor 38 can include either one of the Dolby™ circuits which provide a decoded sub-woofer signal or a single/multistage low pass frequency selective filter 39 shown in FIG. 2. Filter 39 restricts the signal applied to the amplifier 55 and control circuit 52 to a selected band of frequencies. For example, since this particular embodiment is an audio application, the filter 39 restricts the signal to the audio frequency band, or part of it, e.g., sub-woofer audio frequencies. Although a ladder filter is shown, other configurations can be used including active filters.

Further, the filter series resistors 40 rather than being fixed resistors, can be variable resistors as determined by CPU 42. In this way, frequency cut-off of the sub-woofer low pass filter is frequency agile and can be spectrally modified by changing the cut-off frequency depending, e.g., upon the frequency content of the audio signal, the level of the sub-woofer signal, or user settings. Further, an attenuator 44 controlled by CPU 42 can be used to change the amplitude of the sub-woofer signal responsive, e.g., to the level of the audio signal in. In this way, if the audio signal is at a high level, e.g., a high volume control setting, the sub-woofer signal can be reduced to further decrease the loading on power supply 12 and further reduce possible overloading of the sub-woofer amplifier and loudspeaker.

Referring back to FIG. 1, signal processor 38 outputs a sub-woofer signal on line 50 which is coupled to control circuit 52, and to sub-woofer signal processing and power amplifier 55, with its output being coupled to sub-woofer loudspeaker 56. Amplifier 55 is similar to power amplifiers 14, except that it may be more powerful than any single power amplifier of amplifiers 14, and it has a superior low frequency response at sub-woofer audio frequencies.

Control circuit 52 also receives the sub-woofer signal present on lead 50, and receives its power from power supply 12 at node 30. Control circuit 52 actuates coil 56 of switch 54 which in the exemplary embodiment is shown as a single pole single throw relay. Resistor 58 is a power resistor in series with the power supply input 60 of power amplifier 55 and coupled to power supply terminal 30. With relay 54 being unenergized, e.g. terminals 54a and 54b being in their normally closed (nc) position, shorting out resistor 58 and thus providing full power supply power to power amplifier 55 for operating power amplifier 55 at its full capability.

When the signal level at lead 50 reach a predetermined threshold level, as can determined by a comparator (not shown) or some other threshold determination circuit, relay 54 is actuated and terminals 54a and 54b are opened thus inserting resistor 58 in series with the power supply lead 60. In such a mode, as power amplifier 55 draws more current for higher power output to sub-woofer 56, the voltage drop across resistor 58 reduces the voltage/current output capacity for power amplifier 55, thus placing amplifier 55 in a reduced power mode. If desired, reduced power can mean standby, e.g., the value of resistor 58 is large enough to make circuit 54 inoperative with resistor 58 in the circuit, with circuit 54 returning to full operation capacity when resistor 58 is short circuited. The value of resistor 58 is chosen to provide the desired result between the range of a slight reduction in power to inoperative status of circuit 54.

Quite obviously, the low impedance state need not be a short circuit. A resistor of appropriate value and power rating (not shown) can be connected in series with one of terminals 54a/54b so that the impedance in the high impedance state is the series combination of this resistor and resistor 58. In either case, resistor 58 and any resistor placed in series with resistor 58, must have a sufficient power rating.

It should be noted that the insertion of resistor 58 in the power supply input to amplifier 55 also changes the power supply regulation for amplifier 55 and reduces the maximum current available from the power supply. Thus, as used herein, the power supply voltage reduction due to the insertion of the series resistor or variable impedance also includes reduced capability to provide power supply current.

It will be appreciated that other forms of switches could be substituted for the relay 56, e.g., switch 54 comprising an optical coupler using an LED and, e.g., a photo diode, photo-FET transistor, in which case the diode/transistor substitutes for the switch contact, and is connected across resistor 58, Such an arrangement would also be quicker acting than a relay but more expensive.

Various modifications and alternatives are embraced by the present invention. For example, the invention is not limited to the specific examples of switch means described herein, but embraces other arrangements which will provide the operation disclosed. Moreover, the resistor 58 can have a reactive component, or be a combination of resistive, reactive and/or active components, i.e. resistors, inductors, capacitors, or non-linear components, e.g., diodes, zener diodes, transistors.

Although the preferred embodiment of the invention described herein is a sub-woofer loudspeaker with its own power amplifier, it should be appreciated that the invention is applicable to other equipment switchable between operational and reduced power modes in response to a control signal, which in this case is an audio signal within an appropriate audio frequency band. Additionally, relay 54 can be single pole double throw (spdt), e.g., to alternately switch two amplifiers with each deriving their power from a common power supply node, or relay 54 can be a double pole double throw (dpdt) with the other pole switching some other device, e.g., pulsating colored mood lights.

What is claimed is:

1. A power supply circuit arrangement switchable between modes, comprising:
    a main circuit and an auxiliary circuit, each coupled to derive their power supply voltage/current from a common power supply;
    a control circuit having detector means for detecting the level of a signal and providing a control action responsive to the detected level of the signal, and
    variable-impedance means coupled between the common power supply and the auxiliary circuit and responsive to the control action for switching between first and second impedance states, producing respective first and second power supply voltages/currents being received by the auxiliary circuit from the power supply, wherein the first and second voltages/currents correspond to operating and non-zero reduced power modes respectively, and the variable-impedance means is not coupled between the common power supply and the main circuit.

2. The arrangement of claim 1 wherein for the first impedance state the corresponding power supply voltage supplied to the auxiliary circuit permits normal operation and, for the second impedance state the corresponding power supply voltage supplied to the auxiliary circuit is inadequate for its normal operation, whereas the power supply voltages/currents supplied to the main circuit is adequate for its normal operation in both the first and second impedance states.

3. The arrangement of claim 2, wherein the main and auxiliary circuits are speaker drive circuits.

4. The arrangement of claim 3, wherein the auxiliary circuit drives a sub-woofer loudspeaker for outputting a sub-woofer signal from an audio source and the control circuit detects the level of the sub-woofer signal to provide the control action.

5. The arrangement of claim 4, wherein the second impedance state has a higher impedance than the first impedance state.

6. The arrangement of claim 5, wherein if the detected level exceeds a predetermined threshold, the control action causes the variable-impedance means to switch to the second impedance state.

7. An arrangement of claim 1, wherein the variable-impedance means comprises a switch and an impedance.

8. The arrangement of claim 7 wherein the switch and impedance are connected in parallel with each other with the switch being operable in response to the control circuit.

9. The arrangement of claim 8 wherein second impedance state is produced by opening the switch and said first impedance state is produced by closing the switch.

10. An arrangement as defined in claim 9, wherein the switch comprises a relay having switch contacts connected in parallel with said impedance.

11. An arrangement as defined in claim 7, wherein the impedance comprises a resistance.

12. An arrangement as defined in claim 7, wherein the impedance comprises a combination of resistive and reactive components.

13. A power supply circuit arrangement comprising:

an output for providing a first operating voltage to a first circuit;

a control circuit having detector means for detecting the level of a signal and providing a control action responsive to the detected level of the signal; and variable-impedance means coupled between the output and a second circuit, and switchable between higher and lower impedance states by the control action, wherein in the lower impedance state, a power supply voltage provided to the second circuit is a second operating voltage of the second circuit, which is no greater than the first operating voltage, and in the higher impedance state, the power supply voltage provided to the second circuit is a third operating voltage, which is less than the second operating voltage.

14. The arrangement of claim 13, wherein the variable-impedance comprises a switch connected in parallel with an impedance, and the control circuit action operates the switch to select said first and second impedance states, by opening and closing the switch contacts.

15. The arrangement as defined in claim 14, wherein the switch comprises the contacts of a relay.

16. The arrangement of claim 13, wherein the first and second circuits are speaker drive circuits.

17. The arrangement of claim 16, wherein the second operation voltage corresponds to a voltage required by the second circuit under a normal operation, and the third operational voltage is less than the required voltage.

18. The arrangement of claim 16, wherein the second circuit drives a sub-woofer loudspeaker for outputting a sub-woofer signal from an audio source and the control circuit detects the level of the sub-woofer signal to provide the control action.

19. The arrangement of claim 18, wherein if the detected level exceeds a predetermined threshold, the control action causes the variable-impedance means to switch to the higher impedance state.

20. The arrangement of claim 13, wherein the second operating voltage is less than the first operating voltage.

\* \* \* \* \*